United States Patent [19]

Lange et al.

[11] Patent Number: 4,916,613
[45] Date of Patent: Apr. 10, 1990

[54] REMOTE LOW POWER INDICATOR FOR BATTERY DRIVEN APPARATUS

[75] Inventors: Jürgen Lange; Ralph A. Von Vignau, both of Hamburg, Fed. Rep. of Germany

[73] Assignee: U.S. Philips Corporation, New York, N.Y.

[21] Appl. No.: 257,240

[22] Filed: Oct. 13, 1988

[30] Foreign Application Priority Data

Oct. 23, 1987 [DE] Fed. Rep. of Germany ....... 3735854

[51] Int. Cl.$^4$ ...................... E03D 13/00; G06F 15/20
[52] U.S. Cl. ......................................... 364/400; 4/304
[58] Field of Search ................... 4/302, 304; 323/909; 324/426; 340/636; 364/400

[56] References Cited

U.S. PATENT DOCUMENTS

| | | | |
|---|---|---|---|
| 4,578,671 | 3/1986 | Flowers | 340/636 |
| 4,608,714 | 8/1986 | Juengel | 340/636 |
| 4,742,583 | 5/1988 | Yoshida et al. | 4/304 |
| 4,805,247 | 2/1989 | Laverty, Jr. | 4/304 |

Primary Examiner—Jerry Smith
Assistant Examiner—David M. Huntley
Attorney, Agent, or Firm—Bernard Franzblau

[57] ABSTRACT

An arrangement for the control and remote control of a battery driven apparatus is switched on and off upon the approach and withdrawal, respectively, of a user. The arrangement finds particular use in a water-rinsing system, which comprises an electrical adjustment member which can be activated upon the approach of the user. The apparatus transmits infrared detection pulses which are received again after reflection by the user. In response to the reflected pulses a control circuit (2) interrogates the measured charge state of the battery, conditions the adjustment member (7) to be switched on only if the battery (5) has a charge state such that the adjustment member can be switched off again, and transmits infrared state pulses instead of the detection pulses. The state pulses contain information about the charge state of the battery and can be received by an additional remotely located infrared reception unit (12) for evaluation.

12 Claims, 1 Drawing Sheet

REMOTE LOW POWER INDICATOR FOR BATTERY DRIVEN APPARATUS

DISCUSSION OF PRIOR ART AND SUMMARY OF THE INVENTION

The invention relates to an arrangement for control and remote control of an apparatus which can be switched on and off upon approach and withdrawal, respectively, of a user and is driven by a battery, more particularly a water-rinsing system, comprising an electrical adjustment member, which can be activated upon approach of the user, a control circuit, which drives an infrared transmitter for transmission of detection pulses and which conditions the adjustment member for switching-on after reception of the detection pulses reflected by the user in an infrared receiver, and a test unit for measuring the charge state of the battery.

The prospectus "Flushtronic, the first electronic Urinal Rinsing system without current connection" of the Company Keramag discloses the arrangement mentioned in the opening paragraph. Infrared detection pulses are transmitted by an infrared transmitter at given intervals. When a user of the urinal rinsing system reflects the detection pulses, these pulses are received by the infrared receiver and are processed in a control circuit, for example a microprocessor. The control circuit then conditions a rinsing operation. For this purpose, an adjustment member, i.e. a valve, is opened upon initiation of the rinsing operation. Upon approach of the user, the transmission intervals of the detection pulses are shortened. The control circuit checks by means of a test unit the charge state of the battery. When the charge state has fallen below a given value, this is indicated by an optical device on the apparatus. Since the weak charge state of the battery is permanently optically indicated and an optical device, for example a light emitting diode, has a considerably higher energy consumption than a microprocessor, the battery is additionally loaded and is discharged more rapidly. When a motor is used for opening the valve at the water supply, the valve can remain opened when the battery is exchanged too late because the motor does not receive sufficient energy from the battery.

Therefore, the invention has for its object to provide an arrangement for control and remote control of an apparatus that can be switched on and off upon approach an withdrawal, respectively, of a user and is driven by a battery, which ensures that the adjustment member can be switched off again after being switched on and which indicates the charge state of the battery without a substantial additional load occurring.

This object is achieved in an arrangement of the kind mentioned in the opening paragraph in that after reception of the reflected detection pulses the control circuit interrogates the test unit about the measured charge state of the battery, conditions the adjustment member only when the battery has such a charge state that the adjustment member can be switched off again, and subsequently causes the infrared transmitter to transmit state pulses instead of the detection pulses, which contain an information about the charge state of the battery and can be received by an additional infrared reception unit, which comprises an evaluation circuit for evaluating the state pulses and an indication device for indicating the charge state of the battery.

In the arrangement according to the invention, after approach of a user and reflection of the detection pulses the control circuit interrogates the measured charge state of the battery. The measurement of the charge state can be carried out at any instant or only during interrogation. When the battery has such a charge state that the adjustment member can be switched off again after being switched on, the switching-on step is conditioned. Such a conditioning may mean, for example for a urinal water rinsing system, that after a given waiting time a valve (an adjustment member) is opened. After the interrogation of the charge state, the detection pulses are replaced by state pulses, which contain an information about the charge state of the battery. For example, three different indications may be provided, which indicate that the charge of the battery is sufficiently high, weak or very small. The information about the charge state can be evaluated by means of an infrared reception unit (remote operation). An operator posts himself in front of the apparatus and checks whether it is necessary for the battery to be exchanged. The charge state is indicated after the evaluation in the reception unit. After withdrawal of the user, detection pulses are emitted again.

Frequently, multiples of such apparatuses are present at a given place. Each apparatus can then be checked by a reception unit. Therefore, an apparatus does not require any additional indication unit for the charge state. In the case of a weak charge state of the battery, moreover no substantial additional loading of the battery occurs.

The apparatus can be used not only as a water rinsing system, but, for example, also for controlling lamps, which are to be switched on when a person approaches the lamps, or for controlling a door opened upon the approach of a person.

In a further embodiment of the invention it is ensured that after reception of the reflected detection pulses, a checking unit interrogates the state of the adjustment member, and the control circuit additionally supplies to the state pulses an additional information about the state of the adjustment member. In this further embodiment, the operability of the adjustment member is checked. The information about the state of the adjustment member is supplied to the state pulses after checking. Thus, in the case of a defective apparatus, an operator can ascertain by means of the reception unit, in which this information is evaluated, whether this defect originates from the adjustment member.

An apparatus can be constructed so that it serves as a hand rinsing or urinal rinsing system. Both kinds of rinsing systems require a different control of the water supply valve. Therefore, it is ensured that after reception of infrared control pulses, which are supplied by an infrared transmitter unit serving for programming purposes, the control circuit causes the infrared transmitter not to transmit detection or state pulses, and calls a storage, in which the information present in the control pulses for controlling the adjustment member upon activation is stored.

Upon activation of the apparatus, by means of the transmitter unit (remote operation) the processes required for the control of the adjustment member are provided and stored. The required information is contained in control signals, which are received, evaluated and stored by the apparatus. The apparatus then prevents the transmission of detection or state pulses.

After installation of the apparatus, it is required that a remote adjustment is carried out, that is to say, that the distance is adjusted at which it is ensured that reflected pulses reach the receiver. For this purpose, it is ensured that after reception of infrared adjustment pulses, which are supplied by the infrared transmitter unit, the control circuit causes the infrared transmitter to transmit infrared test pulses, which are reflected by a reflector arranged in front of the infrared transmitter and receiver, and carries out an adjustment of the power of the infrared transmitter and/or the infrared receiver by means of a control circuit by determining the strength of the selected test pulses.

The transmitter unit and the receiver unit need not be composed separately, but may be realized as a unit.

An embodiment of the invention will now be described more fully with reference to the accompanying drawing.

DETAILED DESCRIPTION OF THE DRAWING

Figure 1:
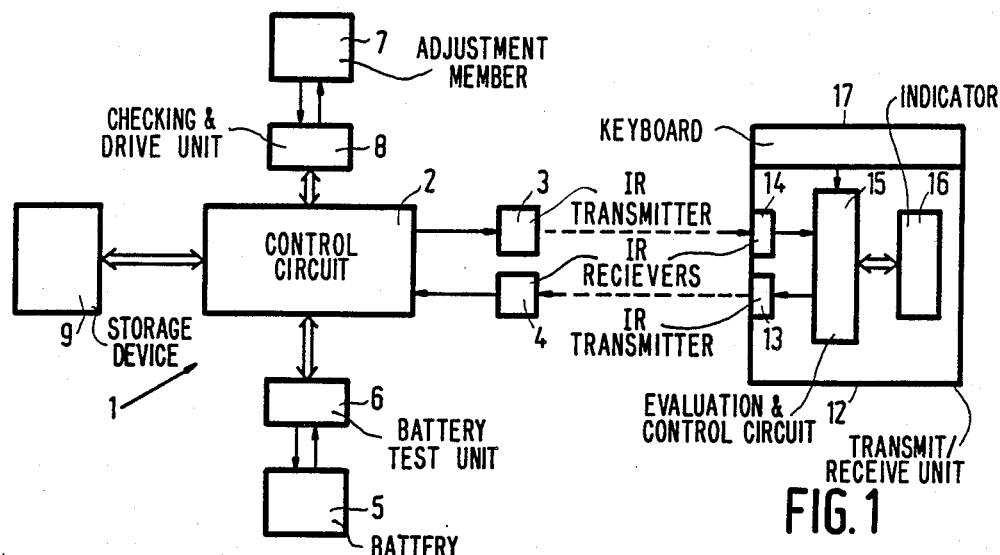
FIG. 1 shows an arrangement comprising an apparatus unit driven by a battery and a transmitter and receiver unit.

FIG. 1 shows an apparatus 1 as a water rinsing system, for example for washing the hands, which upon approach of a user initiates a rinsing operation. The approach of a user is detected by a control circuit 2, for example a microprocessor, by means of an infrared transmitter 3 and an infrared receiver 4. The infrared transmitter 3 transmits at given intervals, for example every other second, infrared detection pulses, which are reflected by the user and are received by the infrared receiver 4. Such detection pulses may consist, for example, of three pulses of the same duration. The control circuit checks after reception of the detection pulses the battery 5, which serves to supply the aparatus 1 with energy, by means of a battery test unit 6. When the charge state of the battery 5 is sufficient, an electrical adjustment member 7, for example a motor, is operated after its operability has been tested. The motor opens a valve in the water supply so that the rinsing operation can be initiated. The adjustment member 7 is controlled by a checking and driving unit 8, which is arranged between the adjustment member 7 and the control circuit 2. The control circuit 2 is further coupled to a storage 9, which contains, for example, control commands for controlling the adjustment member 7, which are interrogated by the control circuit 2.

After the control circuit 2 has carried out the testing of the battery 5 and of the adjustment member 7, state pulses are produced by the control circuit 2 instead of the detection pulses at periodical intervals, which state pulses are transmitted by the infrared transmitter 3 and contain information about the charge state of the battery 5 and about the operating condition of the adjustment member 7. These state pulses can be received, evaluated and indicated by a transmitter and receiver unit 12 (remote operation). The unit 12 also comprises an infrared transmitter 13 and an infrared receiver 14. The infrared pulses received are supplied as electrical pulses to an evaluation and control circuit 15, which after evaluation causes an indication device 16, for example, to represent the charge state of the battery. By means of this transmitter and receiver unit 12, an operator can ascertain a defect of the adjustment member 7 and the charge state of the battery 5. After withdrawal of the user or operator, detection pulses are transmitted again.

When such an apparatus is to be used as a urinal water rinsing system, the control commands stored in the storage 9 must be changed for the adjustment member 7. This is obtained by means of the transmitter and receiver unit 12. By means of a keyboard 17 arranged on the unit 12, control commands can be supplied, which are converted by means of the evaluation and control circuit 15 into correspondingly encoded electrical pulses and are transmitted as infrared control pulses by the infrared transmitter 13. These pulses are then received by the infrared receiver 4 of the unit 1 and are written by means of the control circuit 2 into the storage 9.

Further, by means of the transmitter and receiver unit 12, an adjustment of the transmission power of the infrared transmitter 3 and of the receiving power of the infrared receiver 4 can be carried out. The unit 12 then transmits adjustment pulses, which are received by the infrared receiver 4, are processed by the control circuit 2 and cause the infrared transmitter 3 to transmit test pulses, which are reflected by a reflector positioned in front of the infrared transmitter and the infrared receiver at the desired distance. The test pulses consist of short pulses, which succeed each other at very short intervals. With reference to the received reflected test pulses, the control circuit carries out an adjustment of the infrared transmitter 3 and of the infrared receiver 4.

Figure 2:
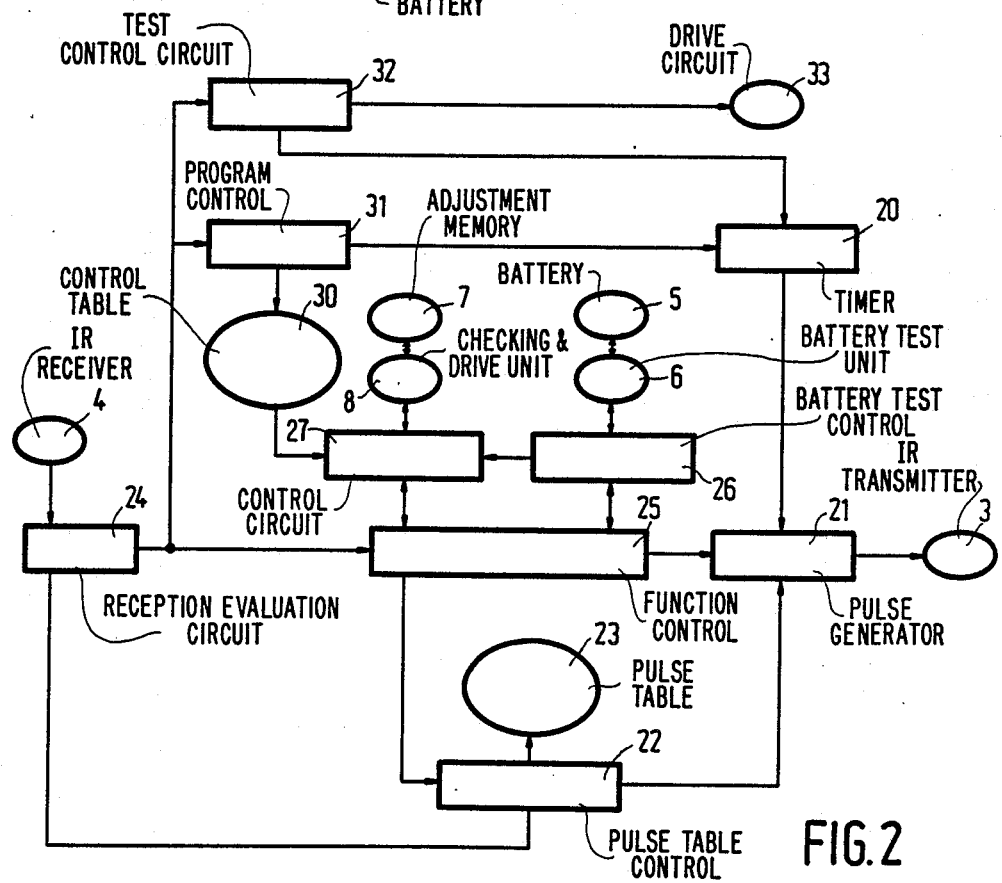
FIG. 2 shows a block circuit diagram for explanation of the control process in the arrangement shown in FIG. 1.

With reference to the block circuit diagram shown in FIG. 2, the processing steps of the control circuit 2 for adjustment, programming and rinsing are explained. The rectangular blocks then relate to the program carried out in the control circuit 2, while the oval blocks relate to arrangements outside the control circuit 2. A rectangular block symbolically represents a function and an arrow indicates data and information. During rinsing, i.e. when upon approach of a user a rinsing operation is to takeplace, a time control circuit 20 causes a pulse generator 21 to emit detection pulses through the infrared transmitter 3. The detection pulses are supplied to the pulse generator 21 by a pulse table control circuit 22, which controls a pulse table 23, in which different pulses to be emitted by the infrared transmitter 3 are stored.

After reception of the detected reflection pulses in the infrared receiver 4, a comparison of the emitted detection pulses present in the pulse table control circuit 22 with the received pulses is effected in the reception evaluation circuit 24. If it is found in the reception evaluation circuit 24 that the pulses correspond to each other, a function check is carried out in the function control circuit 25. First the battery test unit 6 is then interrogated by a battery test control circuit 26 as to the charge stage of the battery 5. If the charge state of the battery is such that a rinsing operation can be initiated and can also be terminated the battery test control circuit 26 releases a circuit 27 for controlling the adjustment member, which causes the checking and driving unit 8 for checking the operability of the adjustment member 7 to be activated. If the adjustment member 7 is not defective, the rinsing operation can be initiated. The battery test control circuit 26 and the circuit 27 for controlling the adjustment member supply information to the operation control circuit 25 about the charge state of the battery 6 and about the operating condition of the adjustment member 7.

The function control circuit 25 passes the information about the charge state of the battery 5 and about the operating condition of the adjustment member 7 on to the pulse table control circuit 22, which searches from the pulse table 23 the pulses corresponding to the states. Subsequently, the function control circuit 25 informs the pulse generator 21 that the battery test and the test of the adjustment member 7 have beeen carried out and it causes the pulse generator 21 to transmit the state pulses, which contain the informaions about the battery 5 and the adjustment member 7 stored in the pulse control circuit 22, through the infrared transmitter 3. By means of the time control circuit 20, it is ensured that the state pulses are transmitted at given intervals. The function control circuit 25 is informed by the pulse generator 21 when state pulses are transmitted. The function control circuit 25 receives from the reception evaluation circuit 24 the information when reflected state pulses are received. A comparison between the received pulses and the pulses stored in the pulse table control circuit 22 is effected in the reception evaluation circuit 24. If the function generator 25 does not receive after a given period of time the information from the reception evaluation circuit 24 that reflected state pulses have been received (withdrawal of the user), the function control circuit 25 acts in such a manner on the pulse table control circuit 22 that the latter again fetches from the pulse table 23 the detection pulses, which are then transmitted again by the pulse generator 21.

In order that the apparatus 1 passes to the programming mode of operation, control pulses must be transmitted by the transmitter and receiver unit. The control pulses contain programming commands, which are evaluated in the control circuit 2 and are stored in a control table 30. The control table 30 and the pulse table 23 are substorages of the storage 9. The corresponding control commands are supplied through the keyboard 17 and are converted into control pulses by the evaluation and control circuit 15.

The control pulses received by the infrared receiver 4 are detected in the reception evaluation circuit 24 and are evaluated by a programming control circuit 31. During the programming mode of operation, the programming control circuit 31 switches off the time control circuit 20 so that the pulse generator 21 can no longer transmit any detection pulses. After the evaluation of the control pulses, the control commands are stored in the control table 30 in the programming control circuit 31. When the adjustment member 7 is switched on, the rinsing operation is now initiated according to the commands stored in the control table 30.

The test mode of operation is also started by the transmitter and receiver unit 12. The test mode of operation is started by adjustment pulses, which are transmitted by the unit 12 to the infrared receiver 4, are identified in the reception evaluation circuit 24 and ensure that the test control circuit 32 is called. The test control circuit 32 changes over the time control circuit 20 in such a manner that it causes at considerably shorter intervals the pulse generator 21 to transmit detection pulses at test pulses through the infrared transmitter 3. A reflector arranged at the desired distance in front of the infrared receiver 4 and the infrared transmitter 3 reflects the test pulses to the infrared receiver 4. With reference to the received test pulses, the test control circuit 32 causes a driving circuit 33 to adjust the optimum power for the transmitter 3 and for the receiver 4 at the chosen distance.

What is claimed is:

1. An arrangement for control and remote control of a battery-driven apparatus that can be switched on and off upo approach and withdrawal, respectively, of a user, more particularly a water rinsing system, comprising:

an electrical adajustment member which can be activated upon approach of the user, a control circuit which drives an infrared transmitter for transmitting detection pulses and conditions the adjustment member for switching-on after reception in an infrared receiver of the detection pulses reflected by a user, and a test unit for measuring the charge state of the battery, wherein, after reception of the reflected detection pulses, the control circuit interrogates the test unit as to the measured charge state of the battery, conditions the adjustment member for switching-on only if the battery has a charge state such that the adjustment member can be switched off again, and subsequently causes the infrared transmitter to transmit state pulses instead of the detection pulses, which state pulses contain information about the charge state of the battery, for reception by a transmit/receive unit which comprises an evaluation circuit for evaluating the state pulses and an indication device for indicating the charge state of the battery.

2. An arrangement as claimed in claim 1, wherein after reception of the reflected detection pulses a checking unit indicates the condition of the adjustment member upon interrogation by the control circuit and wherein the control circuit supplies to the state pulses additional information about the condition of the adjustment member.

3. An arrangement as claimed in claim 2, wherein after reception of infrared control pulses, which are supplied by said transmit/receive unit and which serve for programming purposes, the control circuit causes the infrared transmitter not to transmit any detection or state pulses, and addresses a storage device which, upon activation, stores information present in the control pulses for controlling the adjustment member.

4. an arrangement as claimed in claim 3, wherein after reception of infrared adjustment pulses supplied by said transmit/receive unit, the control circuit causes the infrared transmitter to transmit infrared test pulses, which are reflected by a reflector arranged in front of the infrared transmitter and receiver, and adjusts the power output of the infrared transmitter and/or infrared receiver by means of a driving circuit and as a function of the strength of the reflected test pulses.

5. An arrangement as claimed in claim 1, wherein, after reception of infrared control pulses supplied by said transmit/receive unit and which serve for programming purposes, the control circuit causes the infrared transmitter not to transmit any detection or state pulses, and addresses a storage device which, upon activation, stores information present in the control pulses for controlling the adjustment member.

6. An arrangement as claimed in claim 5 wherein, after reception of infrared adjustment pulses supplied by said transmit/receive unit, the control circuit
causes the infrared transmitter to transmit infrared test pulses, which are reflected by a reflector arranged in front of the infrared transmitter and receiver, and
causes an adjustment of the power output of the infrared transmitter and/or infrared receiver by means of a driving circuit and as determined by the strength of the reflected test pulses.

7. A battery-powered apparatus comprising:
a control unit which comprises,
an electrical adjustment member activated and deactivated by the approach and withdrawal of a user, respectively,
a transmitter for transmitting detection pulses,
a receiver responsive to detection pulses reflected by said user,
a test unit coupled to the battery for monitoring the battery voltage,
a control circuit coupled to said transmitter, said receiver, and the test unit, said control circuit being operative to cause the transmitter to transmit detection pulses and, in response to user-reflected detection pulses supplied by said receiver, to interrogate the test unit as to the voltage level of the battery and to condition the adjustment member for activation only if the battery voltage level is sufficient to insure that the adjustment member can be deactivated again upon withdrawal of the user, said control circuit thereafter causing the transmitter to transmit state pulses which indicate the voltage level of the battery, and
a remotely located transmit/receive unit arranged to receive said state pulses, said transmit/receive unit comprising,
an evaluation circuit for evaluating the state pulses, and
an indication device controlled by said evaluation circuit for indicating the battery voltage level.

8. An apparatus as claimed in claim 7 wherein said control unit further comprises,
a checking unit coupled to said adjustment member and controlled by said control circuit to indicate, after reception by the control unit of said reflected detection pulses, the operability of the adjustment member, and wherein
the control circuit modifies the state pulses to provide, in addition to information as to the battery voltage level, further information as to the operability of said adjustment member.

9. An apparatus as claimed in claim 7 wherein said control unit further comprises,
a pulse generator for selectively generating under control of the control circuit said detection pulses and said state pulses, and
a time control circuit having an output coupled to an input of said pulse generator for controlling the operation of the pulse generator.

10. An apparatus as claimed in claim 7 wherein said transmitter and receiver are adapted to transmit and receive infrared energy, respectively, and wherein said transmit/receive unit includes an infrared receiver and an infrared transmitter for exchanging information between said control unit and said transmit/receive unit via the infrared transmitters and receivers.

11. An apparatus as claimed in claim 7 wherein said control unit further comprises,
an information storage device which stores programming information for operation of the control circuit, and
said transmit/receive unit further comprises,
a keyboard device for generating programming information which is transmitted by a transmitter in said transmit/receive unit and is supplied to said storage device via said receiver in the control unit.

12. An apparatus as claimed in claim 7 wherein said adjustment member comprises a water valve which controls the flow of water to a water utilization device.

* * * * *

UNITED STATES PATENT AND TRADEMARK OFFICE
CERTIFICATE OF CORRECTION

PATENT NO. : 4,916,613
DATED : April 10, 1990
INVENTOR(S) : JURGEN LANGE ET AL

It is certified that error appears in the above-identified patent and that said Letters Patent is hereby corrected as shown below:

```
Column 1, line 17, after "reception" insert --in an infrared
                   receiver--;
                   delete "in";
          line 18, delete "an infrared receiver";
          line 66, delete "an";
Column 2, line 15, delete "an";
          line 24, delete "the" (first occurrence);
          line 43, delete "an";
Column 3, line  4, change "is" (first occurrence) to --be--;
          line 15, change "se-" to --re- --;
          line 16, change "lected" to --flected--;
          line 59, after "2" insert --at periodic intervals--;
          line 60, change "at periodical intervals, which" to
                   --.  These--;
Column 5, line  9, delete "from";
          line 10, after "23" insert --to locate--;
          line 16, after "pulse" insert --table--;
          line 66, change "at" to --as--;
```

UNITED STATES PATENT AND TRADEMARK OFFICE
CERTIFICATE OF CORRECTION

PATENT NO. : 4,916,613

DATED : April 10, 1990

INVENTOR(S) : JURGEN LANGE ET AL

It is certified that error appears in the above-identified patent and that said Letters Patent is hereby corrected as shown below:

Column 6, line 8 (claim 1, line 2), after "driven" insert --water rinsing--;
        line 9 (claim 1, line 3), "upo" to --upon--;
        line 10 (claim 1, line 4), delete "more particularly a water rinsing system,";
        line 12 (claim 1, line 6), change "adajustment" to --adjustment--.

Signed and Sealed this

Fifteenth Day of October, 1991

*Attest:*

HARRY F. MANBECK, JR.

*Attesting Officer*          *Commissioner of Patents and Trademarks*